(12) United States Patent
Bouche et al.

(10) Patent No.: US 9,397,004 B2
(45) Date of Patent: Jul. 19, 2016

(54) METHODS FOR FABRICATING FINFET INTEGRATED CIRCUITS WITH SIMULTANEOUS FORMATION OF LOCAL CONTACT OPENINGS

(71) Applicant: GLOBALFOUNDRIES, Inc., Grand Cayman (KY)

(72) Inventors: Guillaume Bouche, Albany, NY (US); Erik Geiss, Mechanicville, NY (US); Scott Beasor, Rhinebeck, NY (US); Andy Wei, Queensbury, NY (US); Deniz Elizabeth Civay, Clifton Park, NY (US)

(73) Assignee: GLOBALFOUNDRIES, INC., Grand Cayman (KY)

( * ) Notice: Subject to any disclaimer, the term of this patent is extended or adjusted under 35 U.S.C. 154(b) by 4 days.

(21) Appl. No.: 14/164,582

(22) Filed: Jan. 27, 2014

(65) Prior Publication Data

US 2015/0214113 A1    Jul. 30, 2015

(51) Int. Cl.

| | |
|---|---|
| *H01L 21/336* | (2006.01) |
| *H01L 21/8234* | (2006.01) |
| *H01L 29/66* | (2006.01) |
| *H01L 21/027* | (2006.01) |
| *H01L 21/768* | (2006.01) |
| *H01L 21/311* | (2006.01) |
| *H01L 29/78* | (2006.01) |

(52) U.S. Cl.
CPC .... *H01L 21/823431* (2013.01); *H01L 21/0274* (2013.01); *H01L 21/31111* (2013.01); *H01L 21/76897* (2013.01); *H01L 21/823437* (2013.01); *H01L 21/823475* (2013.01); *H01L 29/66545* (2013.01); *H01L 29/785* (2013.01)

(58) Field of Classification Search
CPC ............ H01L 29/66545; H01L 29/66795; H01L 29/66621; H01L 29/401; H01L 29/4236; H01L 21/76897; H01L 21/31053; H01L 21/743; H01L 21/76843; H01L 21/823475; H01L 27/10888; H01L 27/10894; H01L 27/10891; H01L 27/10823; H01L 27/10873; H01L 27/11531; H01L 21/0274; H01L 21/31111; H01L 21/823431; H01L 21/823437; H01L 29/16; H01L 29/495
See application file for complete search history.

(56) References Cited

U.S. PATENT DOCUMENTS

| | | | |
|---|---|---|---|
| 6,149,779 A * | 11/2000 | Van Cleemput | 204/192.37 |
| 6,342,416 B1 * | 1/2002 | Kim et al. | 438/239 |
| 6,348,706 B1 * | 2/2002 | Sandhu | 257/296 |

(Continued)

*Primary Examiner* — Brett Feeney
*Assistant Examiner* — Sophia Nguyen
(74) *Attorney, Agent, or Firm* — Ingrassia Fisher & Lorenz, P.C.

(57) ABSTRACT

A method for fabricating a finFET integrated circuit includes providing a finFET integrated circuit structure including a fin structure, a replacement metal gate structure having a silicon nitride cap disposed over and in contact with the fin structure, a contact structure including a tungsten material also disposed over and in contact with the fin structure, and an insulating layer disposed over the replacement metal gate structure and the contact structure. The method further includes forming a first opening in the insulating layer over the replacement gate structure and a second opening in the insulating layer over the contact structure. Forming the first and second openings includes exposing the FinFET integrated circuit structure to a single extreme ultraviolet lithography patterning. Still further, the method includes removing a portion of the silicon nitride material of the replacement metal gate structure and forming a metal fill material in the first and second openings.

14 Claims, 10 Drawing Sheets

(56) References Cited

U.S. PATENT DOCUMENTS

| | | | |
|---|---|---|---|
| 6,451,708 B1* | 9/2002 | Ha | 438/738 |
| 6,548,313 B1* | 4/2003 | Ravi et al. | 438/6 |
| 6,599,574 B1* | 7/2003 | Yieh et al. | 427/255.29 |
| 7,105,453 B2* | 9/2006 | Chen et al. | 438/700 |
| 7,115,491 B2* | 10/2006 | Huang et al. | 438/586 |
| 7,563,701 B2* | 7/2009 | Chang et al. | 438/597 |
| 7,902,581 B2* | 3/2011 | Frohberg et al. | 257/296 |
| 8,093,150 B2* | 1/2012 | Beck et al. | 438/638 |
| 8,129,843 B2* | 3/2012 | Arnold et al. | 257/758 |
| 8,252,696 B2 | 8/2012 | Lu et al. | |
| 8,951,907 B2* | 2/2015 | Richter et al. | 438/626 |
| 2002/0105088 A1* | 8/2002 | Yang et al. | 257/774 |
| 2003/0100172 A1* | 5/2003 | Kim et al. | 438/585 |
| 2005/0085072 A1* | 4/2005 | Kim et al. | 438/684 |
| 2005/0186792 A1* | 8/2005 | Takahashi | 438/673 |
| 2005/0250311 A1* | 11/2005 | Miyajima et al. | 438/623 |
| 2005/0277258 A1* | 12/2005 | Huang et al. | 438/300 |
| 2008/0029821 A1* | 2/2008 | Yamagami et al. | 257/365 |
| 2008/0081472 A1* | 4/2008 | Tanaka | 438/682 |
| 2010/0197097 A1* | 8/2010 | Hasunuma et al. | 438/284 |
| 2010/0216293 A1* | 8/2010 | Kwon et al. | 438/303 |
| 2010/0327413 A1 | 12/2010 | Lee et al. | |
| 2011/0097821 A1* | 4/2011 | Sirard et al. | 438/4 |
| 2011/0221034 A1* | 9/2011 | Kawakita | 257/532 |
| 2012/0146106 A1* | 6/2012 | Richter et al. | 257/288 |
| 2012/0153405 A1* | 6/2012 | Heinrich et al. | 257/410 |
| 2012/0268159 A1* | 10/2012 | Cho et al. | 324/762.01 |
| 2013/0065371 A1* | 3/2013 | Wei et al. | 438/294 |
| 2013/0137257 A1* | 5/2013 | Wei et al. | 438/586 |
| 2013/0193489 A1 | 8/2013 | Baars et al. | |
| 2013/0277680 A1* | 10/2013 | Green et al. | 257/76 |
| 2014/0077305 A1* | 3/2014 | Pethe et al. | 257/368 |
| 2014/0145246 A1* | 5/2014 | Ning et al. | 257/280 |
| 2014/0264628 A1* | 9/2014 | Lin et al. | 257/401 |
| 2014/0312398 A1* | 10/2014 | Ching et al. | 257/288 |
| 2015/0041854 A1* | 2/2015 | Wang et al. | 257/190 |
| 2015/0102392 A1* | 4/2015 | Yu et al. | 257/288 |
| 2015/0118837 A1* | 4/2015 | Shieh et al. | 438/586 |

* cited by examiner

US 9,397,004 B2

METHODS FOR FABRICATING FINFET INTEGRATED CIRCUITS WITH SIMULTANEOUS FORMATION OF LOCAL CONTACT OPENINGS

TECHNICAL FIELD

The present disclosure generally relates to methods for fabricating integrated circuits. More particularly, the present disclosure relates to methods for fabricating FinFET integrated circuits with simultaneous formation of local contact openings.

BACKGROUND

The majority of present day integrated circuits are implemented by using a plurality of interconnected field effect transistors (FETs), also called metal oxide semiconductor field effect transistors (MOSFETs), or simply MOS transistors. A MOS transistor includes a gate electrode as a control electrode formed over a semiconductive substrate, and spaced apart source and drain electrodes within the substrate between which a current can flow. A control voltage applied to the gate electrode controls the flow of current through a channel in the semiconductive substrate between the source and drain electrodes. Dielectric materials, such as silicon dioxide, are commonly employed to electrically separate the various gate electrodes in the integrated circuit.

A FinFET is a type of transistor that lends itself to the dual goals of reducing transistor size while maintaining transistor performance. The FinFET is a three-dimensional transistor formed in a thin fin that extends upwardly from the semiconductor substrate. Transistor performance, often measured by its transconductance, is proportional to the width of the transistor channel. In a FinFET, the transistor channel is formed along the vertical sidewalls of the fin, so a wide channel, and hence high performance, can be achieved without substantially increasing the area of the substrate surface required by the transistor.

FIG. 1 illustrates, in a cut away perspective view, a portion of a prior art FinFET integrated circuit (IC) 100. The illustrated portion of IC 100 includes two fins 102 and 104 that are formed from and extend upwardly from a bulk semiconductor substrate 106. A gate electrode 108 overlies the two fins and is electrically insulated from the fins by a gate insulator (not illustrated). End 110 of fin 102 is impurity doped to form the source of a field effect transistor 112 and end 114 of that fin is appropriately impurity doped to form the drain of the FET. Similarly, ends 116 and 118 of fin 104 form the source and drain, respectively, of another FET 120. The illustrated portion of IC 100 thus includes two FETs 112 and 120 having a common gate electrode 108. In another configuration, if source 110 and 116 are electrically coupled together and drains 114 and 118 are electrically coupled together the structure would be a two-fin FinFET having twice the gate width of either FET 112 or 120. Oxide layer 122 forms electrical isolation between fins and between adjacent devices as is needed for the circuit being implemented. The channel of FinFET 112 extends along the sidewall 124 of fin 102 beneath gate electrode 108 as well as along the opposite sidewall not visible in this perspective view. The advantage of the FinFET structure is that although the fin has only the narrow width represented by the arrows 126, the channel has a width represented by at least twice the height of the fin above oxide 122. The channel width thus can be much greater than fin width.

In the fabrication of such FinFET integrated circuits, during front end-of-the-line (FEOL) processing, a plurality of semiconductor devices (e.g., transistors, resistors, capacitors, and the like) are formed on the semiconductive substrate. The semiconductor devices are then locally interconnected during middle-of-the-line (MEOL) processing to produce the integrated circuit, such as a logic circuit or a memory cell. To enable the local interconnection of the semiconductor devices during MEOL processing, device-level conductive structures or "plugs" are formed in ohmic contact with the electrically-active areas of the substrate (commonly designated as "RX") and the gate conductors (commonly designated as "PC"), and local interconnect conducive lines are formed in ohmic contact with the device-level plugs of the semiconductor device.

In many cases, such as in replacement gate-based processes, the local interconnect lines and device-level plugs are divided into three general categories: (i) trench-with-late-silicide contacts (referred to herein as "TS contacts") in ohmic contact with RX; (ii) local interconnect lines (referred to herein as "CA contacts") in ohmic contact with the TS contacts; and (iii) plugs in ohmic contact with PC (referred to herein as "CB contacts"). The TS, CA, and CB contacts are collectively referred to herein as the "local contacts." The local contacts may also include shared TS/CA/CB contacts, which provide an electrically-bridged connection to both RX and PC. The TS contact can also include a direct liner contact to RX, for instance by means of a Ti/TiN liner, without involving a silicidation and etch process. After formation of the local contacts, the fabrication process advances to back end-of-the-line (BEOL) processing during which additional BEOL layers are formed to globally interconnect the integrated circuits, which are subsequently separated into individual die during wafer dicing.

From one circuit generation or "node" to the next, critical dimensions are continually reduced and pattern densities are continually increased. To enable the production of highly-dense circuit layouts, MEOL patterning processes have been developed wherein multiple masks are utilized to pattern the dielectric layers deposited over the semiconductor devices (e.g., the pre-metal dielectric layer and the overlying inter-metal dielectric layer), which are subsequently filled with metal and polished to produce the local contacts. For instance, immersion lithography can be used for advanced technologies at the 20 nm or 14 nm minimum gate-length nodes. The CA contacts may thus be printed with a first mask and a first illumination source, while the CB contacts are printed with a second mask and a second illumination source. For the 14 nm node, or more advanced nodes further, it can happen for instance that the resolution of the immersion lithography is not good enough to print all CA patterns with one mask. This patterning is then handled using two or even three masks (e.g., three-color CA), and introduces new challenges in terms of overlay and cost with so-called triple-patterning. All the same, the patterning of the CB contacts to gate may require more than one mask (e.g., two-color CB). Thus, in any case, the current state of the art is to employ multiple/separate patterning and etching processes for the formation of CA and CB contacts, for example up to five separate processes (three for CA, two for CB). Separate patterning and etching steps increase the required fabrication time and expense. Separate patterning and etching steps also increase the likelihood of fabrication-related errors, which may result in device failure.

Extreme ultraviolet (EUV) lithography has been developed to allow better resolution of patterns, and carries the potential for instance to resolve all CA contact openings at once (thus, reducing three steps to a single step). Yet, the added costs of the EUV technology make it questionable whether it would be viable economically should its capability be restricted to replace only three immersion lithography steps by one EUV lithography step. Prospects for EUV would be substantially increased, from a cost perspective, if all five separate patterning processes (when performed using immersion lithography) for printing the CA and CB contacts could be resolved into a single patterning process.

Accordingly, it is desirable to provide improved methods for fabricating FinFET integrated circuits focusing on reducing MEOL fabrication time and expense. Particularly, it is desirable to provide such methods that reduce the number of patterning and etching steps required to fabricate the CA and CB local contact openings. Still further, it is desirable to reduce the number of such patterning and etching steps such that it is economically viable to employ EUV lithography in place of conventional immersion lithography. Furthermore, other desirable features and characteristics of the present disclosure will become apparent from the subsequent detailed description and the appended claims, taken in conjunction with the accompanying drawing figures and the foregoing technical field and background of this disclosure.

BRIEF SUMMARY

Various exemplary methods for fabricating integrated circuits are provided herein. In one exemplary embodiment, a method for fabricating an integrated circuit includes forming a fin structure on a semiconductor substrate, forming a gate electrode structure over the fin structure, forming a silicon nitride capping layer over the gate electrode structure, and forming a TS contact plug over the fin structure and adjacent to the gate electrode structure. The TS contact plug is formed such that a top surface thereof is coplanar with a top surface of the silicon nitride capping layer over the gate electrode structure. The method further includes forming a low-k insulating layer over the silicon nitride capping layer and over the TS contact plug and forming at least two openings in the low-k insulating layer. A first opening of the at least two openings exposes the top surface of the silicon nitride capping layer. A second opening of the at least two openings exposes the top surface of the TS contact plug. Further, the step of forming the at least two openings is performed using a single etching step. Still further, the method includes extending the first opening to form an extended first opening that extends the first opening to the gate electrode structure while not extending the second opening and depositing a conducting material in the extended first opening and the second opening to form contacts to the gate electrode and to the TS contact plug.

In another exemplary embodiment, a method for fabricating a FinFET integrated circuit including providing an integrated circuit structure including a planarized surface, wherein a first portion of the planarized surface includes a silicon nitride material and a second portion of the planarized surface includes a tungsten material, forming a low-k insulating layer over the planarized surface, including over both the first and second portions, and forming first and second openings in the low-k insulating layer, wherein forming the first opening exposes the first portion and wherein forming the second opening exposes the second portion, and wherein the first and second openings are formed simultaneously. The method further includes removing a portion of the silicon nitride material of the first portion while not removing any of the tungsten material of the second portion and forming a metal fill material in the first and second openings.

In yet another exemplary embodiment, a method of fabricating a finFET integrated circuit includes providing a finFET integrated circuit structure including a fin structure, a replacement metal gate structure having a silicon nitride cap disposed over and in contact with the fin structure, a contact structure including a tungsten material also disposed over and in contact with the fin structure, and an insulating layer disposed over the replacement metal gate structure and the contact structure. The method further includes forming a first opening in the insulating layer over the replacement gate structure and a second opening in the insulating layer over the contact structure, wherein forming the first and second openings includes exposing the FinFET integrated circuit structure to a single extreme ultraviolet lithography patterning process. Still further, the method includes removing a portion of the silicon nitride material of the replacement metal gate structure while not removing any of the tungsten material of the contact structure and forming a metal fill material in the first and second openings.

BRIEF DESCRIPTION OF THE DRAWINGS

The various embodiments will hereinafter be described in conjunction with the following drawing figures, wherein like numerals denote like elements, and wherein.

DETAILED DESCRIPTION

Figure 2:
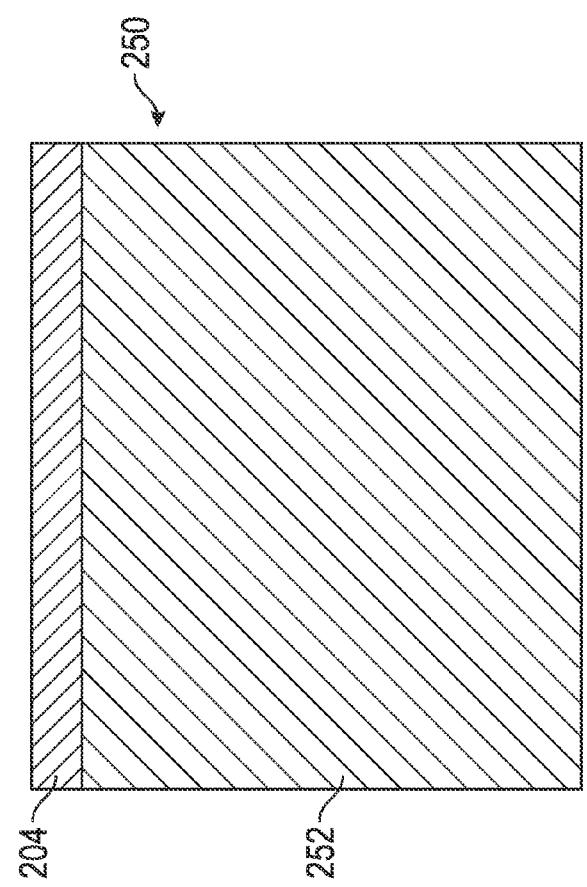
FIGS. 2-12 illustrate, in cross section, FinFET integrated circuit structures and methods for fabricating FinFET integrated circuits in accordance with various embodiments of the present disclosure.
Figure 1:
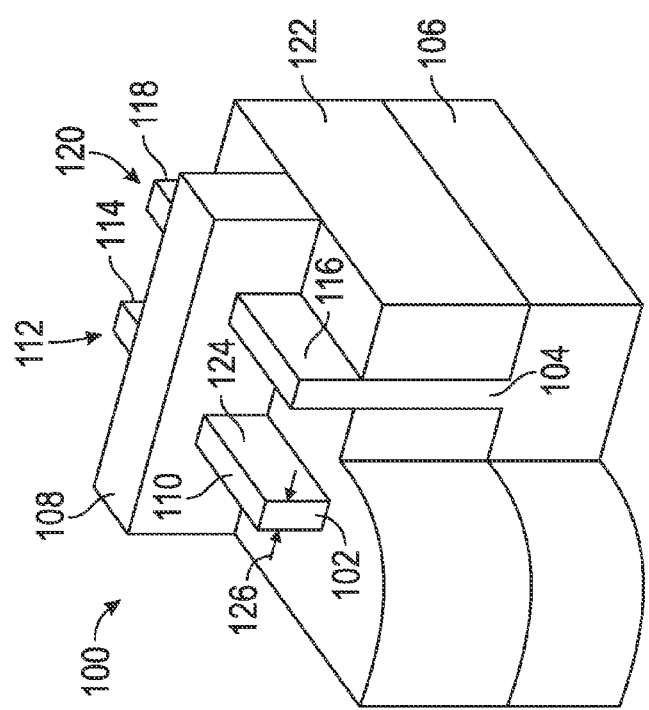
FIG. 1 illustrates, in a cut away perspective view, a portion of a prior art FinFET integrated circuit.

The following detailed description is merely illustrative in nature and is not intended to limit the embodiments of the subject matter or the application and uses of such embodiments. Furthermore, there is no intention to be bound by any expressed or implied theory presented in the preceding technical field, background, brief summary or the following detailed description.

Embodiments of the present disclosure are directed to methods for fabricating integrated circuits, and in particular FinFET integrated circuits using fewer masking, patterning, and etching steps than in methods previously known in the art. In particular, the methods described herein provide steps that allow for the simultaneous formation of both CA contacts (to the TS contact plugs) and CB contacts (to the gate electrodes) using a single photolithographic masking and patterning step using EUV lithography, thus resolving what conventionally takes five separate masking and patterning steps using conventional immersion lithography into a single process. The method thus simplifies the fabrication process over the prior art, which previously required separate photolithographic masking and patterning steps for the CA and CB contacts.

For the sake of brevity, conventional techniques related to semiconductor device fabrication may not be described in detail herein. Moreover, the various tasks and process steps described herein may be incorporated into a more comprehensive procedure or process having additional steps or functionality not described in detail herein. In particular, various steps in the manufacture of semiconductor based transistors are well known and so, in the interest of brevity, many conventional steps will only be mentioned briefly herein or will be omitted entirely without providing the well-known process details.

FIGS. 2-12 illustrate, in cross section, FinFET integrated circuit structures and methods for fabricating FinFET integrated circuits (ICs) in accordance with various embodiments of the present disclosure. As illustrated in cross section in FIG. 2, an exemplary method for fabricating a FinFET IC 250 in accordance with one embodiment begins by providing a semiconductor substrate 252. Semiconductor substrate 252 may be, for example, a monocrystalline wafer of silicon, silicon admixed with germanium, or other semiconductor material commonly used in the semiconductor industry for the fabrication of semiconductor integrated circuits. Semiconductor substrate 252 may alternatively be provided with a buried insulating layer (not shown) formed between the substrate material and a corresponding "active" silicon-based material layer, thereby providing a silicon-on-insulator (SOI) configuration. A well region of semiconductor substrate 252 (not shown) may be doped with conductivity determining impurities. If the FinFET IC being fabricated is a CMOS IC, there will be at least one well region of the semiconductor substrate that is impurity doped with N-type impurities and at least one well region doped with P-type impurities. The well region, either N-type or P-type, may be doped, for example, by ion implantation. Multiple ion implantation steps may be used to achieve the desired dopant concentration and profile. The dopant profile is determined to establish, among other concerns, the desired threshold voltage for the device being fabricated. A layer of silicon nitride 204 or other hard mask material is deposited overlying the surface of the semiconductor substrate 252. The hard mask material may be deposited by chemical vapor deposition (CVD), low pressure chemical vapor deposition (LPCVD), plasma enhanced chemical vapor deposition (PECVD), or the like.

Figure 3:
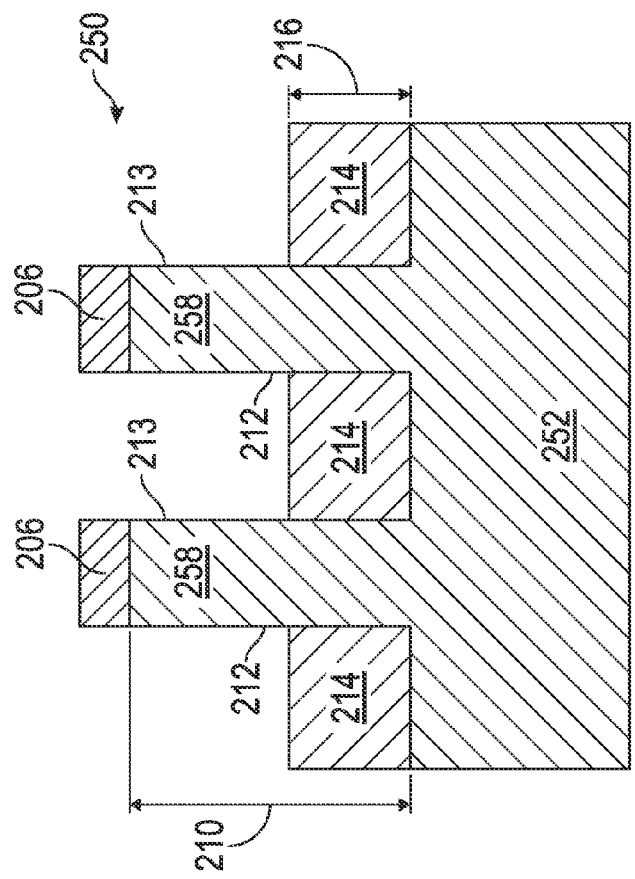

The method in accordance with one embodiment continues as illustrated in FIG. 3. The layer of silicon nitride 204 or other hard mask material is patterned to form an etch mask 206 overlying the intended locations of a plurality of fins. The semiconductor substrate 252 exposed by the etch mask is anisotropically etched to form a plurality of fins 258, only two of which are illustrated. The semiconductor substrate 252 may be etched, for example by reactive ion etching (RIE) using any of the common semiconductor etchants. Fins 258 have the same impurity doping type and concentration as the semiconductor region from which they were etched, thus forming a doped channel region. The fins 258 are also characterized by the height by which they extend above the surface of the remaining semiconductor substrate, indicated by double headed arrow 210, and by opposing sidewalls 212 and 213. The region adjacent to and between adjacent ones of the plurality of fins is partially filled with an insulator 214. The insulator may be, for example, an oxide layer blanket deposited from a tetraethyl orthosilicate (TEOS) source using low-pressure chemical vapor deposition (LPCVD) or a high density plasma (HDP) process to cover the fins 258 and to completely fill the region between the fins 258. The deposited oxide may be planarized, for example by chemical mechanical planarization (CMP), and then etched to the desired height. The resulting thickness of insulator 214, indicated by double headed arrow 216, is less than the height 210 of fins 258.

Figure 4:
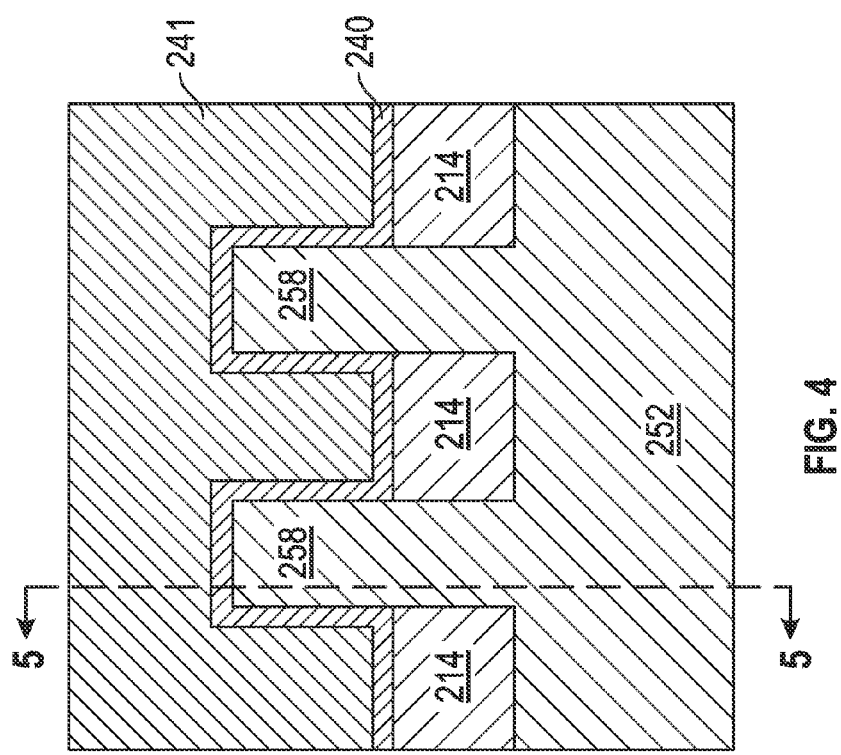

As illustrated in FIG. 4, the method continues in accordance with replacement gate or "gate last" fabrication processes that are known in the art. For example, in one embodiment, the method continues by depositing a dummy gate structure that is formed by forming one or more layers of dielectric material 240, such as an oxide material, overlying the fins 258, and forming one or more layers of a dummy gate electrode material, such as a polycrystalline silicon (polysilicon) material, overlying the layer(s) of dielectric material 240, followed by suitable patterning and etching steps, to form a dummy gate 241.

Figure 5:
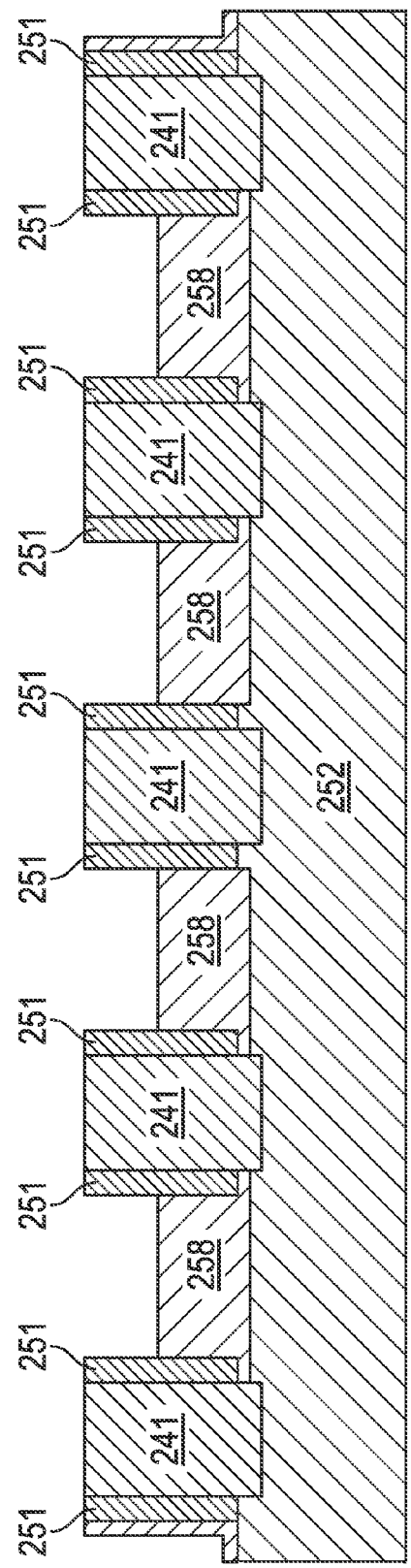

After forming the dummy gate 241, and with reference to FIG. 5 (which is a cross-section perpendicular to that shown in FIGS. 1-4, through the dummy gate 241 and in front of the fins 258), the fabrication of FinFET transistor devices continues by forming regions that provide electrical connections between adjacent fins 258 and function as source/drain regions for the FinFET transistor devices. In accordance with one embodiment, a spacer 251 is formed about the dummy gate structure 241. The source/drain regions are doped (e.g., by implanting dopant ions of a conductivity-determining impurity type opposite the doping of the channel portion of the fins 258 underlying the dummy gate structure 241) to create the source and drain regions (not shown) for the semiconductor device structure. It should be understood that the fabrication process described herein is not constrained by the number of source/drain regions or the manner in which the source/drain regions are formed.

Figure 6:
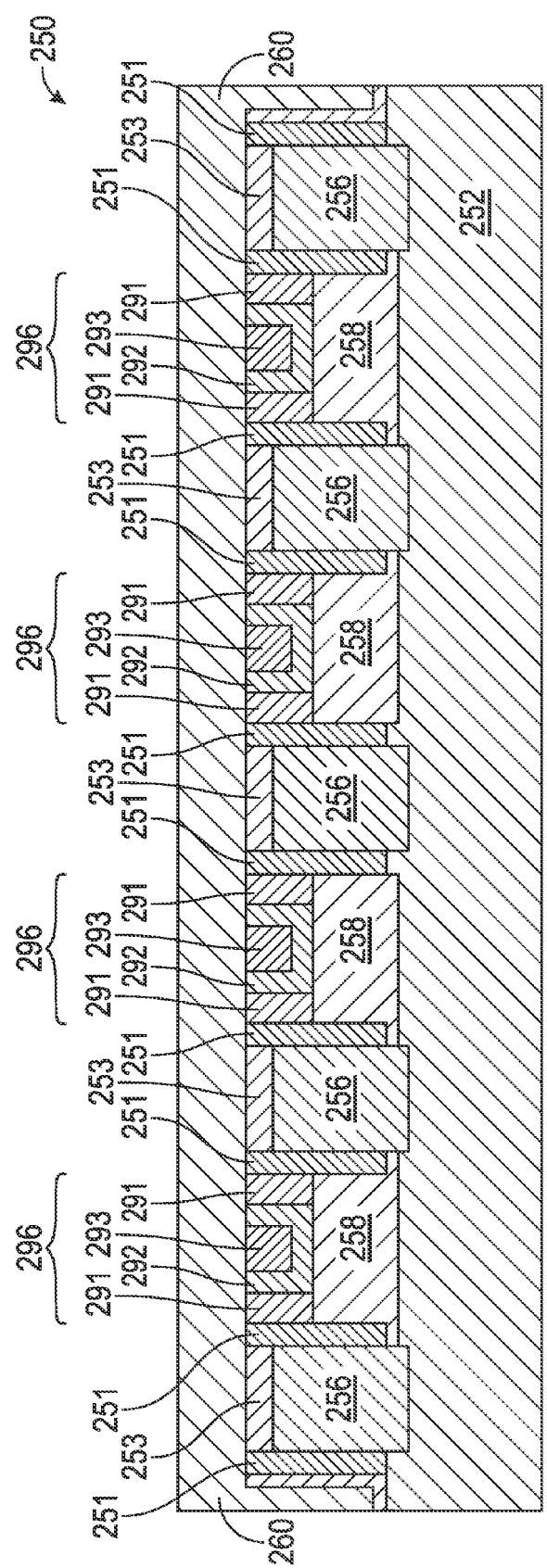

In an exemplary embodiment, the fabrication process continues by removing the dummy gate electrode material to form voided regions corresponding to the dummy gate structure (not separately illustrated). Removal of the dummy gate electrode material 241 creates a voided region that defines a subsequently formed replacement gate structure. Referring now to FIG. 6, in an exemplary embodiment, the fabrication process continues by forming a replacement gate structure 256 in the voided region. The replacement gate structure 256 functions as the gate electrode for the FinFET transistor structures formed on the semiconductor substrate 252, and preferably includes at least one layer of gate dielectric material and at least one layer of conductive gate electrode material. In an exemplary embodiment, the replacement gate structure 256 is realized as a high-k metal gate that is formed by forming a layer of a high-k dielectric material (not separately illustrated) in the voided regions and forming one or more layers of conductive metal material overlying the high-k dielectric material, for example having a higher dielectric constant than silicon dioxide. After depositing the layer of high-k dielectric material, the layer of conductive metal material is formed by conformably depositing a metal material, such as tungsten (W), overlying the high-k dielectric material to a thickness chosen such that the metal material fills the voided regions, thus forming replacement metal gates 256. A subsequent step involves capping the gate with a protective dielectric cap 253. To do so, the W replacement gate is recessed within its cavity by means for instance of a wet etch, or a partial RIE, or a combination of both, to create the space for a cap. A dielectric, for instance PECVD silicon nitride or HDP nitride is deposited. A chemical-mechanical planarization (CMP) process follows that removes the nitride from the top of the wafer, over the interlayer dielectric, and just leaves the nitride cap 253 in the recess over the gate metal. The purpose of this cap 253 is to act as a protection for the gate during the subsequent processes, most notably the patterning of the TS contacts to the device source and drain.

With continuing reference to FIG. 6, a plurality of TS contact plugs 296 may be formed to provide ohmic contact with the active areas ("RX") of the fins 258. The contact plugs 296 are typically formed by using a tungsten-based metal 293 together with an interlayer dielectric stack 291 that may include silicon dioxide in combination with an etch stop material, such as a silicon nitride material. The process involves depositing the interlayer dielectric, patterning the contact holes by using either one or several shots of immersion lithography (several shots being necessary if the density required cannot be resolved with only one exposure), then dry etching the interlayer dielectric according to the pattern before performing the metal fill. The contact plug 296 may further include an appropriate barrier layer system 292, which may be accomplished on the basis of a sputter deposition technique, for instance, for the barrier materials 292, and chemical vapor deposition (CVD)-like process recipes for forming the tungsten material 293. The contact plugs 296 are then planarized so as to be planar with the protective capping layer 253 over the gate electrodes 256. Once the fabrication of the TS contact plugs is completed, the integrated circuit 250 may be covered with a protective low-k insulating layer 260 having a dielectric constant lower than silicon dioxide, for example a silicon oxide material such as TEOS.

As previously noted, in the prior art, to enable the production of highly-dense circuit layouts, MEOL patterning processes have been developed wherein multiple masks are utilized to pattern the dielectric layers deposited over the semiconductor devices (e.g., the pre-metal dielectric layer and the overlying inter-metal dielectric layer), which are subsequently filled with metal and polished to produce the local contacts. The CA contacts are printed with up to three different masks, while the CB contacts are printed with up to two different masks, thus possibly requiring five separate masking and patterning procedures to form the CA and CB contacts, using conventional immersion lithography. Thus, the current state of the art is to employ separate patterning and etching processes for the formation of CA and CB contacts. Separate patterning and etching steps increase the required fabrication time and expense. Separate patterning and etching steps also increase the likelihood of fabrication-related errors. More specifically, lithography overlay requirements can be stringent in modern CMOS technologies. Any out of range misalignment can potentially generate an electrical short, for instance between two contacts, or between a contact and a gate. This in turn results in a device failure and lower yield.

In accordance with the presently-described exemplary method, a patterning process is described that allows for the simultaneous patterning of openings for both the CA contacts (to the previously-described TS plugs 296) and the CB contacts (to the gate electrodes 256) using EUV lithography in contrast to conventional immersion lithography, using, for example, a 193 nm illumination source. As noted above, the TS contact plugs 296 are planarized so as to be coplanar with the protective silicon nitride capping layer 253. Thus, to allow for a patterning step that simultaneously forms openings for both the TS plugs 296 and the gate electrodes 256 (for CA and CB contacts, respectively), a patterning and etching procedure should be employed that is able to etch the silicon nitride of the capping layer 253 to expose the gate electrodes 256, but that does not etch the tungsten of the TS plugs 296 or the TEOS insulating layer 260. The following disclosure provides such a procedure.

Figure 7:
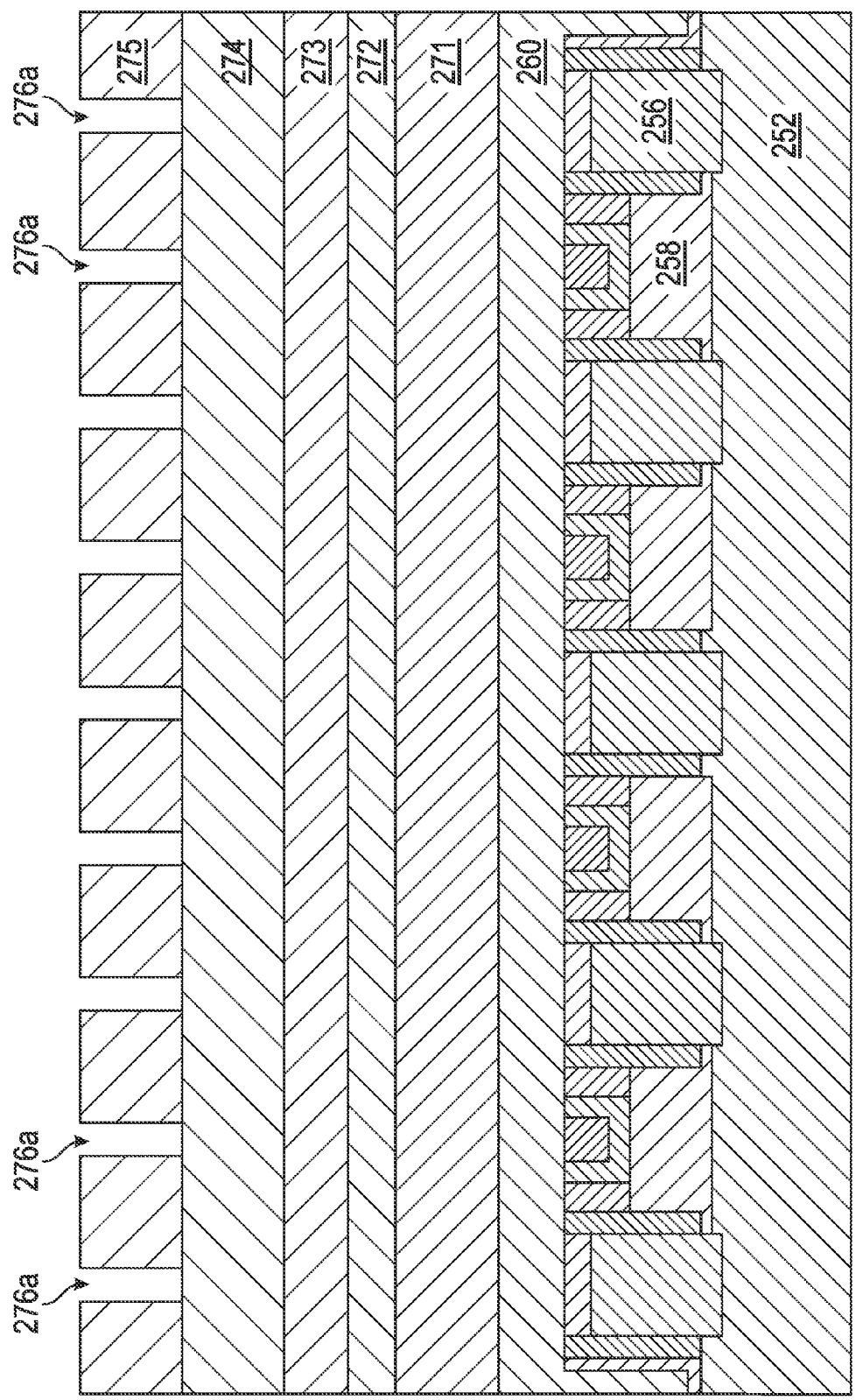

With reference now to FIG. 7, an exemplary photolithographic masking "stack" is deposited on top of the IC 250, namely on top of TEOS insulating layer 260, that is suitable for use with EUV lithography. The photolithographic masking stack may include an amorphous carbon layer 271, a SiON etch stop layer 272, a further TEOS layer 273, a bottom anti-reflective coating ("BARC") layer 274, and a photoresist layer 275, although other photolithographic masking stacks can be used. The etching procedure begins with a first step of transferring a pattern into the photoresist layer 275, for example, by exposing the photoresist material to appropriate EUV electromagnetic radiation. During semiconductor wafer fabrication, in contrast to conventional 193 nm immersion lithography, extreme ultraviolet light may be utilized in a lithographic process to enable transfer of very small patterns, such as nanometer-scale patterns, from an optical mask to a semiconductor wafer. In EUV lithography, a pattern formed on an EUV lithographic mask (also referred to as an EUV "reticle" in the present application) may be transferred to a semiconductor wafer by reflecting EUV light off of portions of a reflective surface. The transferred pattern is illustrated as openings 276a in FIG. 7.

Figure 8:
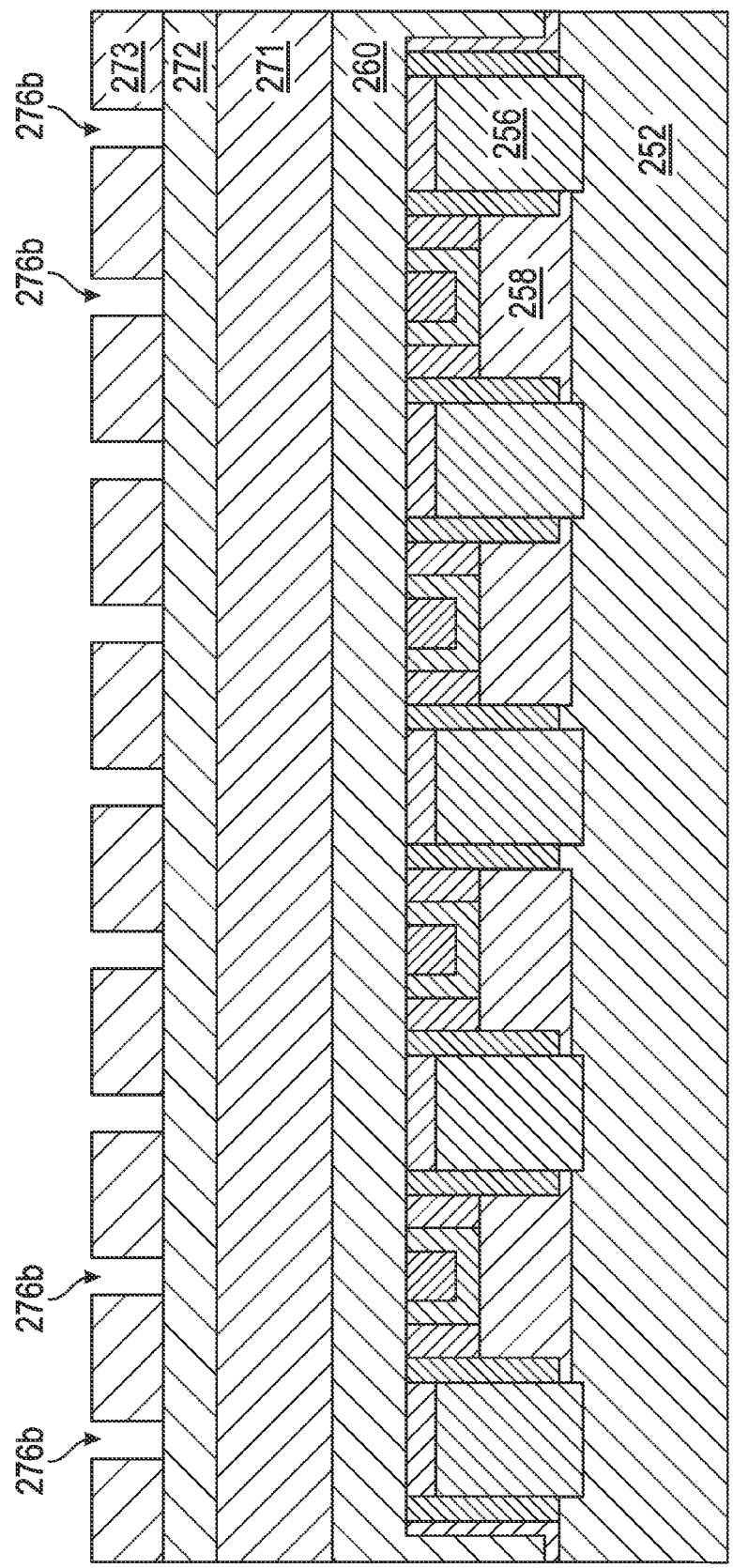

Thereafter, the pattern is transferred to the TEOS layer 273 by etching through the BARC layer 274 and into the TEOS layer 273. The SiON layer 272, as noted above, serves as an effective etch stop layer for this etching step. Suitable etching techniques may include, for example, "dry" etching techniques such as reactive ion etching (RIE) using a suitable etching chemistry. As shown in FIG. 8, the patterning is transferred into TEOS layer 273 as openings 276b formed therein. The remaining portions of BARC layer 274 may thereafter be removed, for example by an appropriately selective etching procedure.

Figure 9:
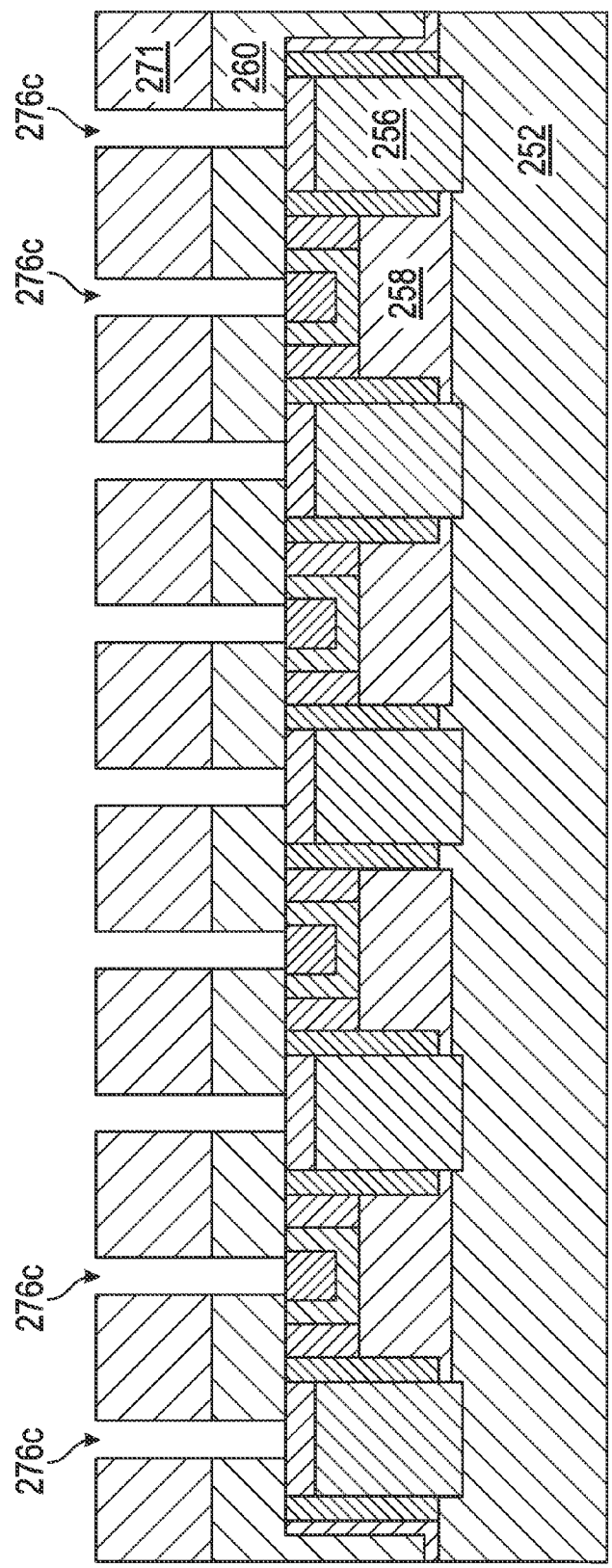
Figure 10:
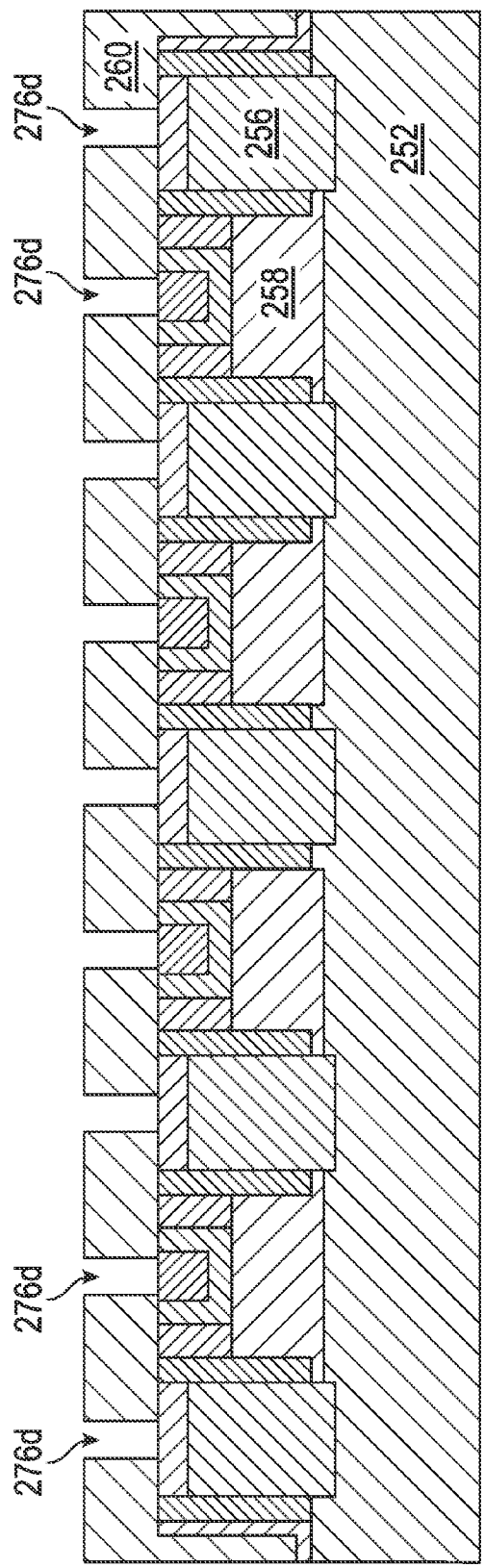

The method thereafter continues with reference to FIG. 9, and the transfer of the pattern into the amorphous carbon layer 271 and the TEOS insulating layer 260. Again, suitable etching techniques may include, for example, "dry" etching techniques such as reactive ion etching (RIE) using a suitable etching chemistry. As shown in FIG. 9, the patterning is transferred into TEOS layer 260 as openings 276c formed therein. SiN capping layer 253 and tungsten 293 of TS plugs 296 serve as a suitable etch stop. The remaining portions of amorphous carbon layer 271 may thereafter be removed, for example by an appropriately selective etching procedure, as shown in FIG. 10, with openings 276d remaining in TEOS insulating layer 260.

Figure 11:
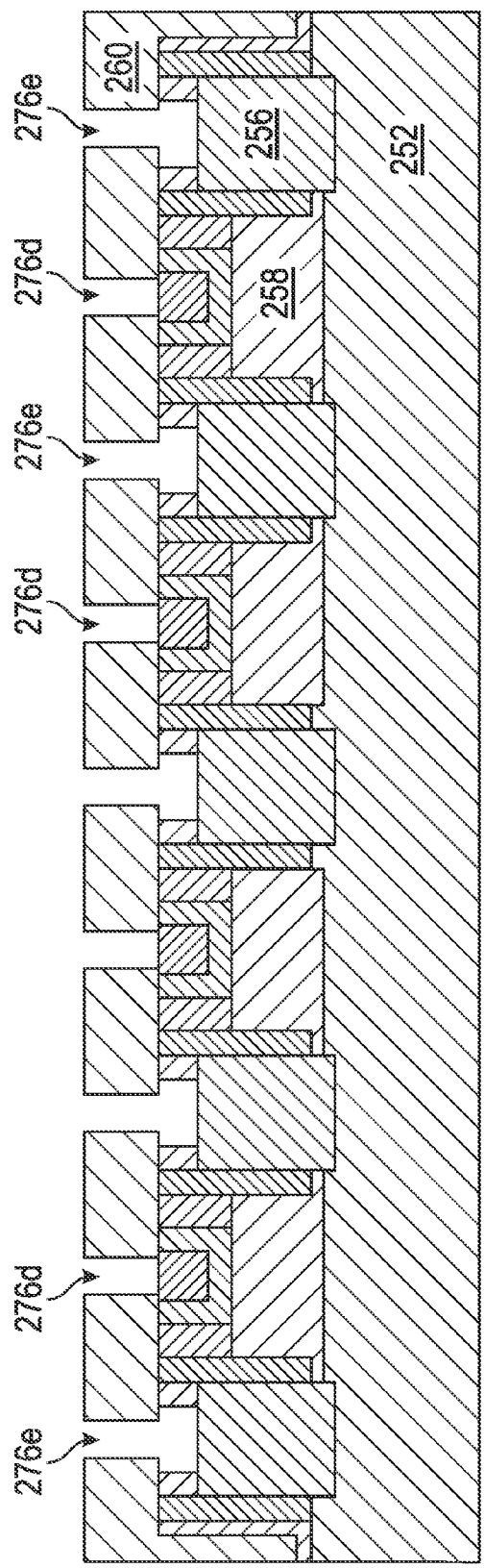

At this point in the exemplary method, it becomes desirable to etch the SiN capping layer 253 selectively to the tungsten 293 of TS plugs 296, and also selectively to the TEOS of layer 260, as noted above. This etching step is performed to form an opening in the SiN layer 253 to expose the gate electrode 256, while avoiding etching any of the tungsten in the TS plugs 296. In one embodiment, this etching step may be performed using the Frontier™ etching tool available from Applied Materials, Inc. of Santa Clara, Calif., USA. The Frontier™ etching tool offers the capability to remove SiN selectively to silicon oxide, TEOS, or tungsten. As such, etching using this tool will remove the SiN material from capping layer 253, while not damaging the tungsten of TS plugs 296. As shown in FIG. 11, this etch results in openings 276e (i.e., extensions of openings 276d into the SiN layer 253 for those openings 276d that are positioned over the gate electrodes 256). As further shown in FIG. 11, there may be some degree of "under-etching" of the TEOS layer 260, wherein some or all of the SiN thereunder may be removed (partial removal being shown in the Figure). It is an advantage of the present method that due to the selectivity of the nitride removal to the TEOS, the contact hole dimension, critical, remains unchanged. A less selective process would result in this critical dimension being exceeded.

Figure 12:
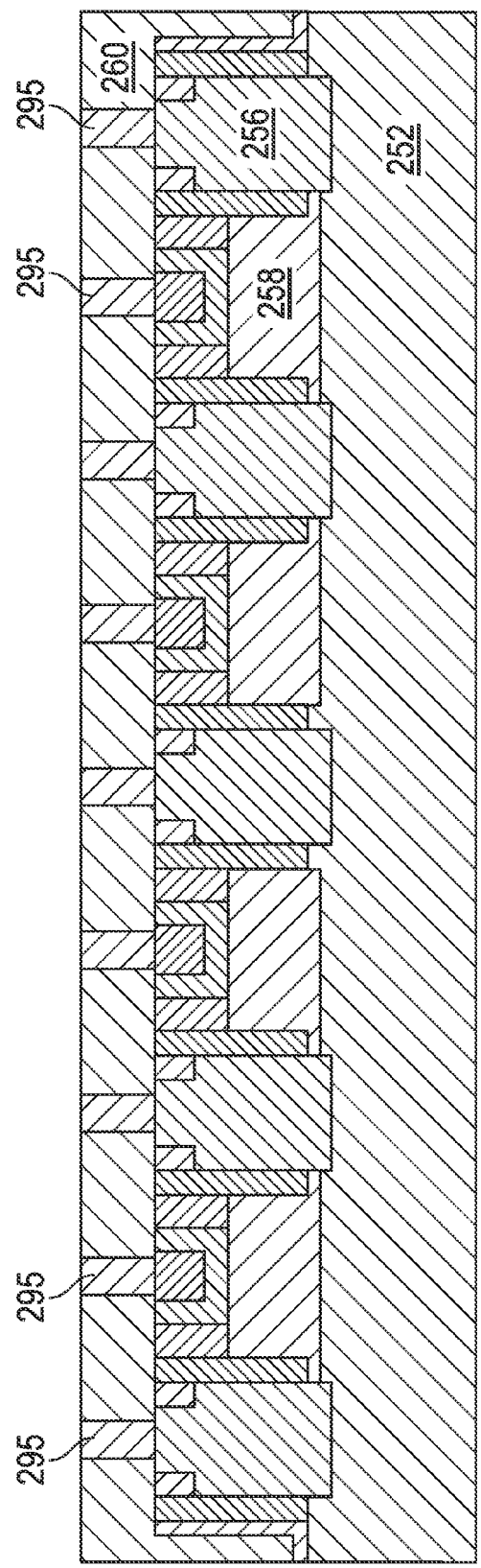

The method continues with regard to FIG. 12, wherein the CA and CB contacts (collectively shown in FIG. 12 as "CC" contacts 295) are simultaneously formed in the openings 276d and 276e. The CC contacts 295 may include, for example, a tungsten-based material or other suitably conductive material. The CC contacts 295 may be deposited using a suitable deposition technique, for example, a CVD technique. A polishing or planarization step may be performed after the deposition step to remove any excess conductive material, resulting in the structure shown in FIG. 12. It is also possible to provide a CC contact that actually merges a CA and a CB, therefore allowing electrical "stitching" at the MEOL level Although not illustrated, the partially-formed integrated circuit is completed in a conventional manner by, for example, depositing other interlayer dielectrics, etching contact vias, filling the contact vias with conductive plugs, and the like as are well known to those of skill in the art of fabricating integrated circuits. Additional post-processing may include the formation of further metal and interlayer dielectric layers therebetween to complete the various electrical connections in the integrated circuit. The present disclosure is not intended to exclude such further processing steps as are necessary to complete the fabrication of a functional integrated circuit, as are known in the art.

Thus, the methods described herein have provided steps that allow for the simultaneous formation of both CA contacts (to the TS contact plugs) and CB contacts (to the gate electrodes) using a single EUV photolithographic masking and patterning step. The method thus simplifies the fabrication process over the prior art, which previously required separate photolithographic masking and patterning steps for the CA and CB contacts when using conventional 193 nm immersion lithography.

While at least one exemplary embodiment has been presented in the foregoing detailed description of the disclosure, it should be appreciated that a vast number of variations exist. It should also be appreciated that the exemplary embodiment or exemplary embodiments are only examples, and are not intended to limit the scope, applicability, or configuration of the disclosure in any way. Rather, the foregoing detailed description will provide those skilled in the art with a convenient road map for implementing an exemplary embodiment of the disclosure. It being understood that various changes may be made in the function and arrangement of elements described in an exemplary embodiment without departing from the scope of the disclosure as set forth in the appended claims.

What is claimed is:

1. A method for fabricating a finFET integrated circuit, the finFET integrated circuit being formed at a 14 nm node or smaller, the method comprising:
    forming a fin structure on a semiconductor substrate;
    forming a gate electrode structure over the fin structure, wherein the gate electrode structure comprises a conductive material with insulative sidewall spacers disposed adjacent to and in physical contact with lateral sidewalls of the conductive material;
    forming a silicon nitride capping layer over the conductive material of the gate electrode structure and adjacent to and in between the sidewall spacers;
    forming a tungsten-based TS contact plug over the fin structure and adjacent to and in physical contact with the sidewall spacers of the gate electrode structure, wherein the tungsten-based TS contact plug is formed such that a top surface thereof is coplanar with a top surface of the silicon nitride capping layer over the gate electrode structure;
    forming a low-k insulating layer over the silicon nitride capping layer and over the tungsten-based TS contact plug;
    forming at least two openings in the low-k insulating layer, wherein a first opening of the at least two openings exposes the top surface of the silicon nitride capping layer, and wherein a second opening of the at least two openings exposes the top surface of the tungsten-based TS contact plug that is adjacent to and in direct physical contact with the fin structure at the aforesaid 14 nm node, and wherein the step of forming the at least two openings is performed simultaneously using a single etching step, wherein extreme ultraviolet (EUV) etching procedures are used to perform the simultaneous etching;
    extending the first opening to form an extended first opening that extends the first opening to the gate electrode structure while not extending the second opening, wherein extending the first opening comprises performing an under-etch of the silicon nitride capping layer below non-etched portions of the low-k insulting layer, and wherein extending the first opening comprises performing an etching process that etches silicon nitride selective to the tungsten-based TS contact plug and the low-k insulating layer; and depositing a conducting material in the extended first opening and the second opening to form contacts to the gate electrode and to the tungsten-based TS contact plug.

2. The method of claim 1, wherein forming the fin structure comprises forming the fin structure on a monocrystalline silicon wafer.

3. The method of claim 1, wherein forming the gate electrode structure comprises forming a dummy gate electrode structure, removing the dummy gate electrode structure, and forming a replacement metal gate as the gate electrode structure.

4. The method of claim 3, wherein forming the replacement metal gate comprises forming a metal gate comprising tungsten metal.

5. The method of claim 1, wherein forming the tungsten-based TS contact plug comprises forming a TS contact plug comprising tungsten.

6. The method of claim 1, wherein forming the low-k insulating layer comprises forming a TEOS layer.

7. The method of claim 6, further comprising depositing a masking stack over the TEOS layer.

8. The method of claim 7, wherein depositing the masking stack comprises depositing a masking stack that is compatible with EUV lithography.

9. The method of claim 8, wherein depositing the masking stack comprises depositing a masking stack that comprises a photoresist layer.

10. The method of claim 9, further comprising exposing the photoresist layer to a single EUV lithography process to form patterned openings in the photoresist layer.

11. The method of claim 10, further comprising extending the patterned openings into the masking stack.

12. The method of claim 11, wherein forming at least two openings in the low-k insulating layer comprises extending the patterned openings into the low-k insulating layer.

13. The method of claim 1, wherein extending the first opening comprises performing an etching process that etches silicon nitride selectively to TEOS and tungsten.

14. The method of claim 1, wherein depositing the conducting material comprises depositing a tungsten material.

* * * * *